(12) United States Patent
Jeong

(10) Patent No.: US 6,867,646 B2
(45) Date of Patent: Mar. 15, 2005

(54) DEMODULATION APPARATUS FOR DIGITAL AUDIO AMPLIFIER

(75) Inventor: Bong Soo Jeong, Incheon (KR)

(73) Assignee: PULSUS Technologies, Seoul (KR)

( * ) Notice: Subject to any disclaimer, the term of this patent is extended or adjusted under 35 U.S.C. 154(b) by 0 days.

(21) Appl. No.: 10/431,092

(22) Filed: May 7, 2003

(65) Prior Publication Data

US 2004/0075490 A1 Apr. 22, 2004

(51) Int. Cl.[7] .............................................. H03F 3/217
(52) U.S. Cl. ...................... 330/10; 330/195; 330/207 A
(58) Field of Search .......................... 330/10, 165, 195, 330/207 A, 251

(56) References Cited

U.S. PATENT DOCUMENTS 6,281,767 B1 * 8/2001 Lastrucci ..................... 333/167

* cited by examiner

Primary Examiner—Steven J. Mottola
(74) Attorney, Agent, or Firm—Volpe and Koenig, P.C.

(57) ABSTRACT

Disclosed is a demodulation apparatus for a digital audio amplifier capable of solving a space, cost and heat generation of the digital audio amplifier. The demodulation apparatus includes a first inductor connected between a positive digital audio signal output terminal and one end of a load, a second inductor connected between a negative digital audio signal output terminal and the other end of the load, and magnetically coupled to the first inductor, a first capacitor connected between the one end of the load and ground and coupled to the first inductor for serving as a low-pass filter, and a second capacitor connected between the other end of the load and ground and connected to the second inductor for serving as a low-pass filter.

2 Claims, 5 Drawing Sheets

DEMODULATION APPARATUS FOR DIGITAL AUDIO AMPLIFIER

BACKGROUND OF THE INVENTION

1. Field of the Invention

The present invention relates to a digital audio amplifier, and more particularly, to a demodulation apparatus for a digital audio amplifier.

2. Description of the Related Art

Generally, the purpose of a digital audio amplifier is to minimize distortion of a signal and to output high fidelity audio signals by digitally processing a received audio signal.

Referring to FIG. 1, which indicates a block diagram of a conventional digital audio amplifier, a digital audio amplifier 104 receives a digital audio signal and amplifies it in a digital state.

As shown in FIG. 2, the digital audio amplifier 104 includes a micro controller 202, a digital audio signal conversion section 204, and an amplification output section 214. The micro controller 202 controls a sound controller 208 of the digital audio signal conversion section 204 so as to provide effective acoustic control.

An input section 206 of the digital audio signal conversion section 204 selects any one of a plurality of input signals or transforms the sampling rate of the selected digital audio signal. The sound controller 208 is composed of a digital signal processor (DSP), and performs tone control, graphic equalizing, volume control, sound field control or the like, under the control of the micro controller 202. An oversampling digital filter 210 artificially increases the sampling frequency by use of interpolation in order to facilitate the design of a low-pass filter that is a demodulation apparatus 106 and to improve a ratio of S/N (signal to noise). A PCM-PWM conversion section 212 is a DDC (digital to digital converter) so that a PCM-type digital audio signal is converted into a PWM-type digital audio signal.

The amplification output section 214 is composed of a gate driver 216 and a MOSFET bridge circuit 218. The gate driver 216 outputs a signal to drive the MOSFET bridge circuit 218, and has a high output current and a low output impedance.

The MOSFET bridge circuit 218 outputs a high output voltage and a high current so as to apply the high current to a load having a low impedance, such as a speaker. Since the PWM-type digital audio signal is a square wave having a high frequency, an MOSFET is used as an output device.

The demodulation apparatus 106 shields a high frequency component and passes a low frequency component only, both of which are contained in the PWM-type digital audio signal, so as to demodulate the PWM-type digital audio signal into an analog audio signal.

The demodulation apparatus 106 that is employed in the digital audio amplifier and that uses an analog-to-digital (AD) drive type digital audio signal will now be described with reference to FIG. 3.

The demodulation apparatus 106 is composed of two low-pass filters, first low-pass filter A and second low-pass filter B. The first low-pass filter A, which is interposed and connected between a positive digital audio signal output terminal and one end of the load, is composed of a first inductor L1 and a first capacitor C1. The first low-pass filter A demodulates the positive digital audio signal into an analog audio signal and outputs the result to one end of the load. The second low-pass filter B, which is interposed and connected between a negative digital audio signal output terminal and the other end of the load, is composed of a second inductor L2 and a second capacitor C2. The second low-pass filter B demodulates the negative digital audio signal into the analog audio signal and outputs the result to the other end of the load. In the AD drive type, the negative digital audio signal is the reversed shape of the positive digital audio signal.

Since the demodulation apparatus 106 employed in the digital audio amplifier includes a plurality of inductors L1 and L2, problems exist in terms of limited space, high costs, and heat generation in the digital audio amplifier. In order to cope with the heat generation in the digital audio amplifier, the conventional amplifier employs components with high heat resistance or a plurality of heat sinks. Accordingly, the dimensions or costs of the digital audio amplifier may not be reduced all the more.

SUMMARY OF THE INVENTION

Accordingly, the present invention is directed to a demodulation apparatus for a digital audio amplifier that substantially obviates one or more of the problems of the related art.

It is an object of the present invention to provide a demodulation apparatus for a digital audio amplifier capable of solving the problems of limited space, high costs and heat generation.

To achieve these objects and other advantages and in accordance with the purpose of the invention, as embodied and broadly described herein, there is provided with a demodulation apparatus for an analog-to-digital (AD) drive type digital audio amplifier, comprising: a first inductor connected between a positive digital audio signal output terminal and one end of a load; a second inductor connected between a negative digital audio signal output terminal and the other end of the load, and magnetically coupled to the first inductor; a first capacitor connected between the one end of the load and ground and coupled to the first inductor for serving as a low-pass filter; and a second capacitor connected between the other end of the load and ground and connected to the second inductor for serving as a low-pass filter.

With the construction of the present invention, the use of the paired inductor in the digital audio amplifier may minimize space and heat generation within the digital audio amplifier, thereby decreasing the costs as well.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiment of the present invention, an example of which is illustrated in the accompanying drawings.

Figure 1:
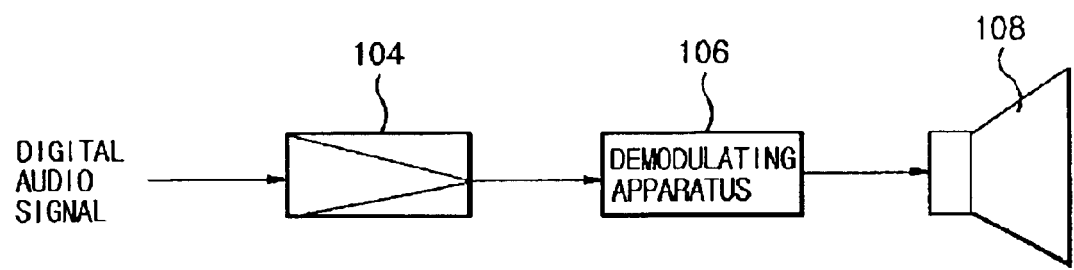
FIG. 1 is a block diagram of a conventional digital audio amplifier.
Figure 2:
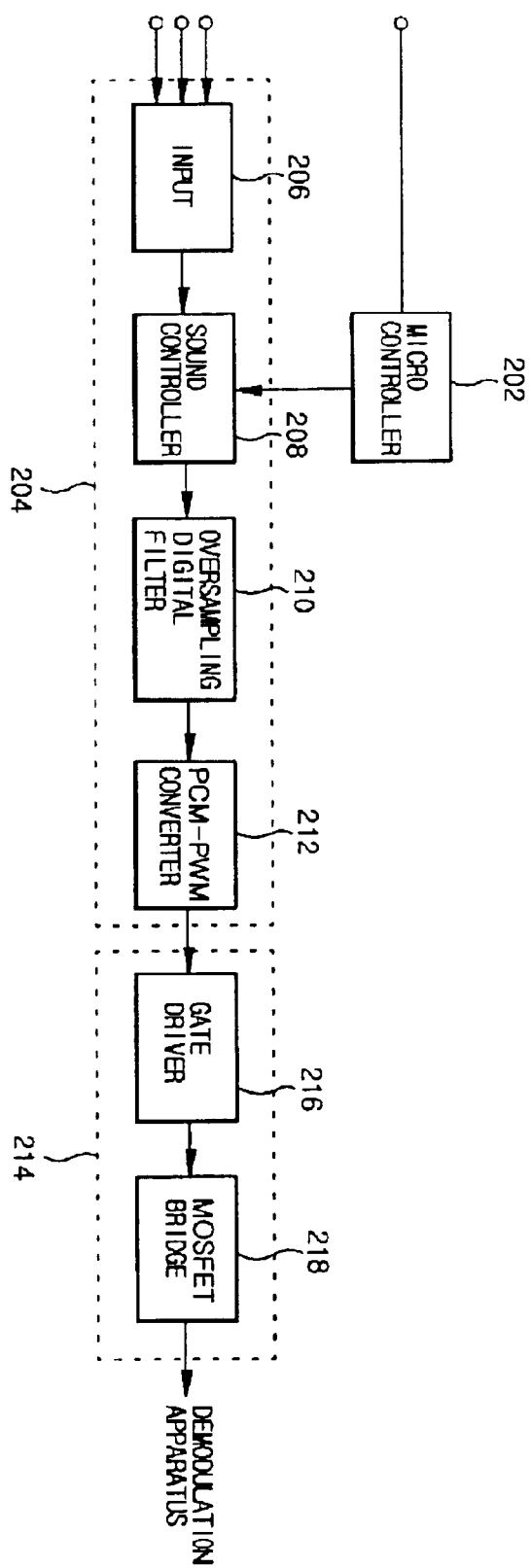
FIG. 2 is a detailed book diagram of the digital audio amplifier shown in FIG. 1.
Figure 3:
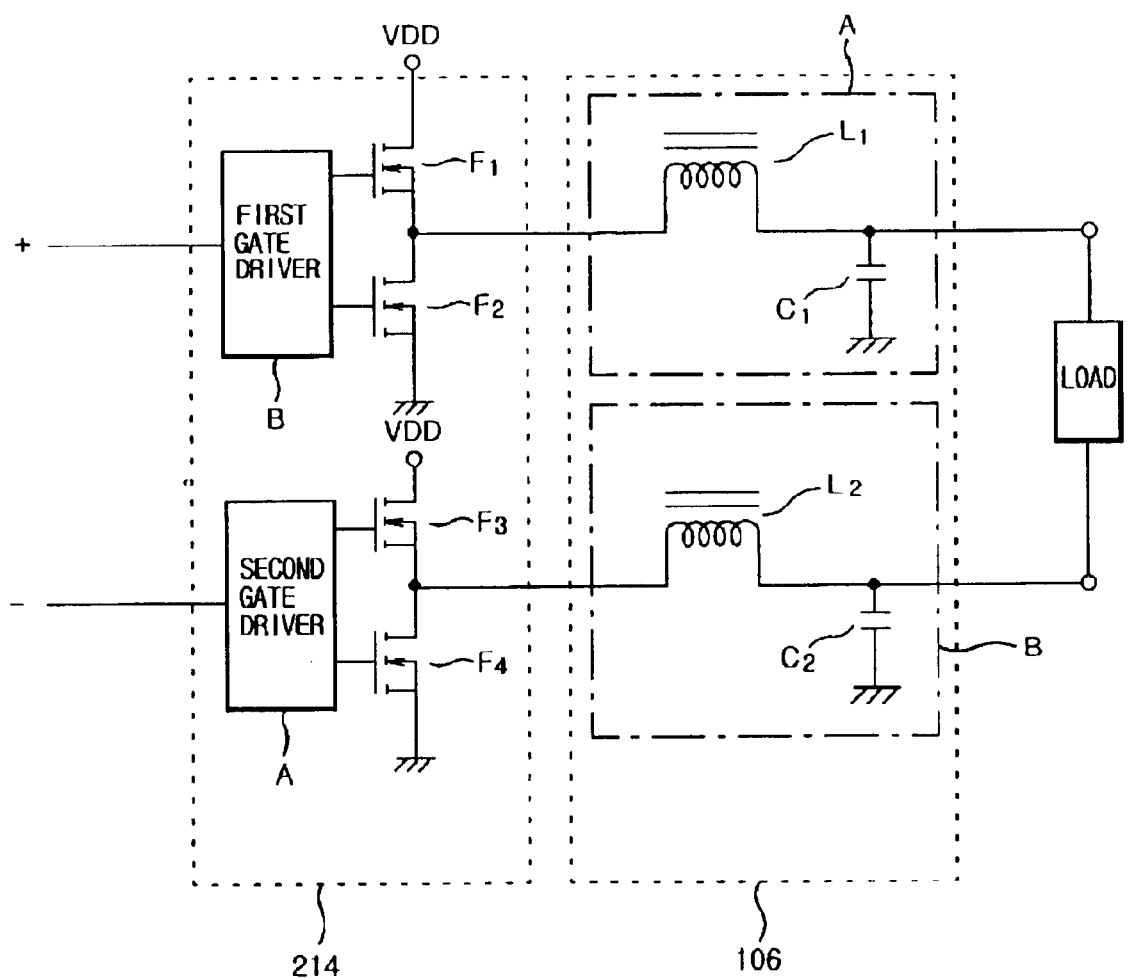
FIG. 3 is a schematic circuit diagram showing the construction of the amplifier and demodulating apparatus shown in FIG. 2.
Figure 4:
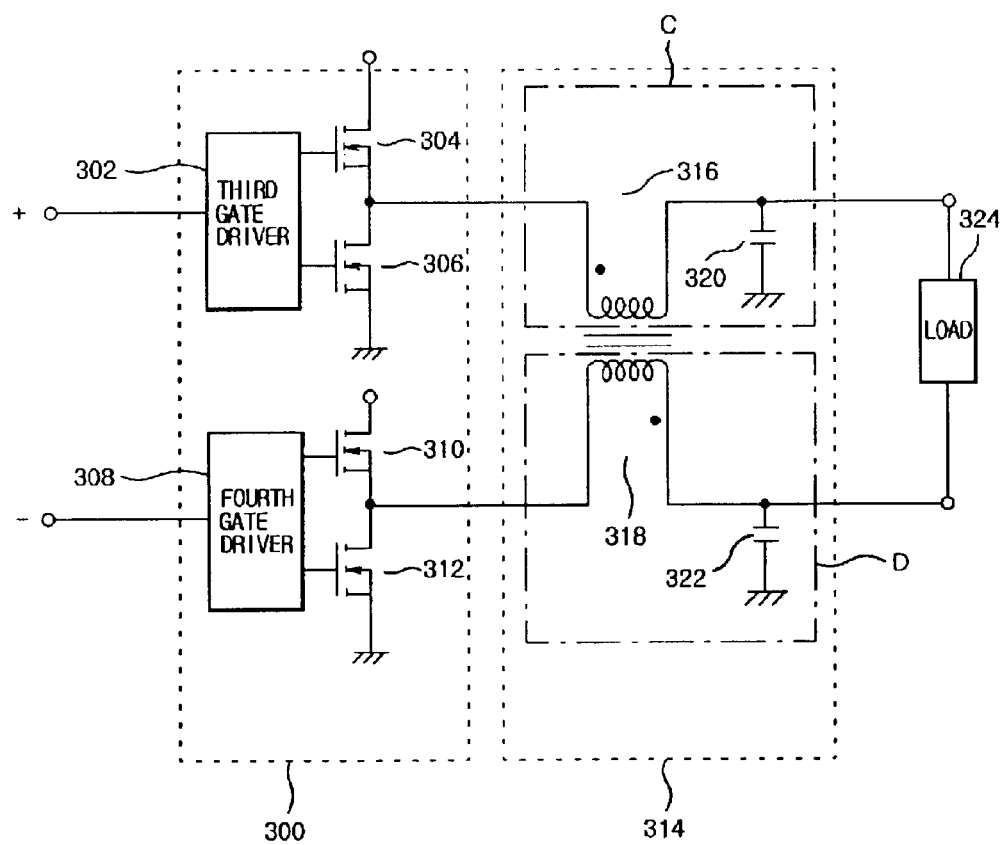
FIG. 4 is a schematic circuit diagram showing the construction of a demodulation apparatus for a digital audio amplifier according to one preferred embodiment of the present invention.

A demodulation apparatus for a digital audio amplifier according to one preferred embodiment of the present invention will now be described with reference to FIG. 4.

The demodulation apparatus 314 is composed of two low-pass filters, third low-pass filter C and fourth low-pass filter D. The third low-pass filter C includes a third inductor 316 interposed and connected between a positive digital audio signal output terminal and one end of a load 324, and a third capacitor 320 interposed and connected between one end of the load 324 and the ground. The third low-pass filter C demodulates a positive digital audio signal into an analog audio signal to output the result to one end of the load 324.

The fourth low-pass filter D includes a fourth inductor 318, which is interposed and connected between a negative digital audio signal output terminal and the other end of the load 324, and a fourth capacitor 322, which is interposed and connected between the other end of the load 324 and the ground. The fourth low-pass filter D demodulates a negative digital audio signal into an analog audio signal and outputs the result to the other end of the load 324.

The third inductor 316 of the third low-pass filter C and the fourth inductor 318 of the fourth low-pass filter D are paired inductors having different polarities to each other, but have the same number of windings. The third and fourth inductors 316 and 318 are magnetically coupled to each other in a magnetic aspect, while independently separated in a circuit aspect. The inductors as described above, i.e., where two inductors having the same winding numbers are magnetically coupled under complementary magnetic circumstances, are referred herein to as paired inductors.

The inductance of each component of the paired inductor of a magnetically coupled type is twice as effective as that of a separate inductor, due to the independently constructed circuit, but magnetic couple.

By using the paired inductor, the winding number may be reduced by 70% compared to two independent inductors, thereby reducing the heat generation.

The construction of the paired inductor will now be described with reference to FIGS. 5 and 6.

Figure 5:
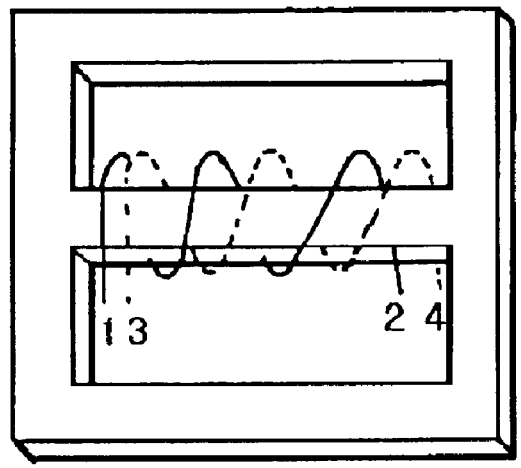
FIGS. 5 and 6 are views illustrating the construction of a paired inductor according to one preferred embodiment of the present invention.
Figure 6:
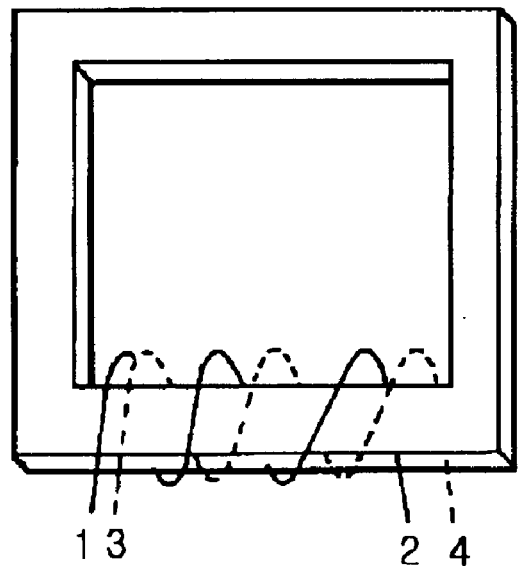

The paired inductor shown in FIG. 5 is two wires wound around a center of a "日"-shaped magnetic core, while the paired inductor shown in FIG. 6 is two wires wound around a portion of a "口"-shaped magnetic core. Since the paired inductor may be formed by two wires around one magnetic core, the paired inductor may be manufactured as one device. In other words, the third inductor 316 and the fourth inductor 318 may be manufactured as one device.

With the above construction, the two separate inductors may be replaced by one paired inductor, thereby minimizing the heat generated from the inductor. In addition, the cost of the amplifier may be decreased, and the component surface mount area may be minimized. Furthermore, it is possible to reduce or decrease a dimension or cost of the component used to solve the problem of heat generation.

The forgoing embodiment is merely exemplary and is not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A demodulation apparatus for an analog-to-digital (AD) drive type digital audio amplifier, comprising:

a first inductor connected between a positive digital audio signal output terminal and one end of a load;

a second inductor connected between a negative digital audio signal output terminal and the other end of the load, and magnetically coupled to the first inductor;

a first capacitor connected between the one end of the load and ground and coupled to the first inductor for serving as a low-pass filter; and a second capacitor connected between the other end of the load and ground and connected to the second inductor for serving as a low-pass filter wherein the first and second inductors are paired inductors having different polarities from each other, but have the same number of windings; and wherein the first and second inductors are two wires wound around a center of a "日"-shaped magnetic core.

2. A demodulation apparatus for an analog-to-digital (AD) drive type digital audio amplifier, comprising:

a first inductor connected between a positive digital audio signal output terminal and one end of a load;

a second inductor connected between a negative digital audio signal output terminal and the other end of the load, and magnetically coupled to the first inductor;

a first capacitor connected between the one end of the load and ground and coupled to the first inductor for serving as a low-pass filter; and a second capacitor connected between the other end of the load and ground and connected to the second inductor for serving as a low-pass filter wherein the first and second inductors are paired inductors having different polarities from each other, but have the same number of windings; and wherein the first and second inductors are two wires wound around a portion of a "口"-shaped magnetic core.

* * * * *